United States Patent
Fan et al.

(10) Patent No.: US 9,467,098 B2
(45) Date of Patent: Oct. 11, 2016

(54) SLEW RATE CONTROL BOOST CIRCUITS AND METHODS

(71) Applicant: QUALCOMM Incorporated, San Diego, CA (US)

(72) Inventors: Xin Fan, Irvine, CA (US); Vijayakumar Dhanasekaran, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/533,928

(22) Filed: Nov. 5, 2014

(65) Prior Publication Data

US 2015/0381120 A1    Dec. 31, 2015

Related U.S. Application Data

(60) Provisional application No. 62/016,835, filed on Jun. 25, 2014.

(51) Int. Cl.
| | |
|---|---|
| H03F 3/26 | (2006.01) |
| H03F 1/32 | (2006.01) |
| H03F 1/02 | (2006.01) |
| H03F 3/04 | (2006.01) |

(52) U.S. Cl.
CPC .............. *H03F 1/32* (2013.01); *H03F 1/0205* (2013.01); *H03F 3/04* (2013.01); *H03F 2200/555* (2013.01); *H03F 2201/3215* (2013.01)

(58) Field of Classification Search
USPC ........................................ 330/267, 302, 264
IPC ....................................................... H03F 3/26
See application file for complete search history.

(56) References Cited

U.S. PATENT DOCUMENTS

| 3,982,174 | A | * | 9/1976 | Maddox | .................. | H02M 1/44 |
|---|---|---|---|---|---|---|
| | | | | | | 323/287 |
| 4,015,212 | A | * | 3/1977 | Miyata | .................. | H03F 3/3044 |
| | | | | | | 330/255 |
| 5,512,859 | A | | 4/1996 | Moraveji | | |

(Continued)

FOREIGN PATENT DOCUMENTS

| WO | 2013179565 A1 | 12/2013 |
|---|---|---|
| WO | 2014018935 A1 | 1/2014 |

OTHER PUBLICATIONS

Dhanasekaran V., et al., "Baseband Analog Circuits in Deep-Submicron CMOS Technologies Targeted for Mobile Multimedia," Aug. 2008, 184 pages.

(Continued)

*Primary Examiner* — Patricia T Nguyen
(74) *Attorney, Agent, or Firm* — Haynes and Boone, LLP

(57) ABSTRACT

The present disclosure amplifier circuits and methods having boosted slew rates. In one embodiment, an amplifier circuit comprises an output stage comprising a first output transistor, the first output transistor comprising a gate, a source, and a drain, wherein the gate receives a signal to be amplified. A bias circuit biases the gate of the first output transistor. A damping circuit is coupled the gate of the first output transistor and is configured to produce a high impedance at low frequencies and a low impedance at high frequencies. The damping circuit includes a current limit circuit to limit current to the gate of the first output transistor when a voltage on the gate of the first output transistor decreases in response to the signal.

20 Claims, 4 Drawing Sheets

(56) References Cited

U.S. PATENT DOCUMENTS

| | | | |
|---|---|---|---|
| 5,654,663 | A | 8/1997 | McClure et al. |
| 5,838,524 | A * | 11/1998 | Phillips ................ G05F 3/247 |
| | | | 361/18 |
| 6,646,508 | B1 * | 11/2003 | Barbetta ............... H03F 1/086 |
| | | | 330/264 |
| 6,801,087 | B2 | 10/2004 | Ausserlechner |
| 6,807,040 | B2 * | 10/2004 | Ivanov ............. H03K 17/0822 |
| | | | 361/93.1 |
| 7,362,173 | B1 | 4/2008 | Knausz |
| 7,372,326 | B1 | 5/2008 | Spears et al. |
| 7,688,147 | B1 * | 3/2010 | Hoover ................ H03F 3/187 |
| | | | 330/258 |
| 7,880,545 | B1 | 2/2011 | Venca et al. |
| 2003/0045251 | A1 * | 3/2003 | Arnott ..................... H03F 1/52 |
| | | | 455/127.1 |
| 2014/0167860 | A1 | 6/2014 | Dhanasekaran |

OTHER PUBLICATIONS

Rezaei M., et al., "Slew rate enhancement method for folded-cascode amplifiers," Electronics Letters, Oct. 9, 2008, vol. 44 (21), 2 pages.

Dhanasekaran V., et al., "Design of Three-Stage Class-AB 16 Headphone Driver Capable of Handling Wide Range of Load Capacitance," IEEE Journal of Solid-State Circuits, vol. 44, No. 6, Jun. 2009, pp. 1734-1744.

International Search Report and Written Opinion—PCT/US2015/033767 ISA/EPO—Aug. 26, 2015.

* cited by examiner

SLEW RATE CONTROL BOOST CIRCUITS AND METHODS

CROSS REFERENCE TO RELATED APPLICATIONS

This application claims priority to U.S. Provisional App. No. 62/016,835 filed Jun. 25, 2014, the content of which is incorporated herein by reference in its entirety for all purposes.

BACKGROUND

The present disclosure relates to electronic circuits and methods, and in particular, to slew rate control boost circuits and methods.

Amplifier circuits are a basic building block on modern electronics. Amplifiers typically receive an input signal and amplify a voltage or current, for example. Such amplifiers are typically constructed from various arrangements of transistors, including bipolar transistors and/or metal oxide semiconductor (MOS) transistors. One common problem with transistor amplifiers pertains to distortion. As signals are processed in the various transistors, asymmetries between devices and a variety of other factors cause the processed signals to be altered. For audio applications, for example, reducing distortion is particularly important.

One factor that can cause distortion is slew rate. Voltage slew rate is a term that refers to the ability of an amplifier to change between a high voltage and a low voltage on a particular node. In some situations, design of an amplifier may lead to asymmetric slew rate, where a positive slew (from a low voltage to a high voltage) occurs at a different rate than a negative slew (from a high voltage to a low voltage). Asymmetry in the slew rate can lead to unwanted distortion.

SUMMARY

The present disclosure includes amplifier circuits and methods with slew rate boost. In one embodiment, an amplifier circuit comprises an output stage comprising a first output transistor, the first output transistor comprising a gate, a source, and a drain, wherein the gate receives a signal to be amplified. A bias circuit biases the gate of the first output transistor. A damping circuit is coupled the gate of the first output transistor and is configured to produce a high impedance at low frequencies and a low impedance at high frequencies. The damping circuit includes a current limit circuit to limit current to the gate of the first output transistor when a voltage on the gate of the first output transistor decreases in response to the signal.

The following detailed description and accompanying drawings provide a better understanding of the nature and advantages of the present disclosure.

DETAILED DESCRIPTION

The present disclosure pertains to circuits and methods for improving slew rate in an amplifier. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
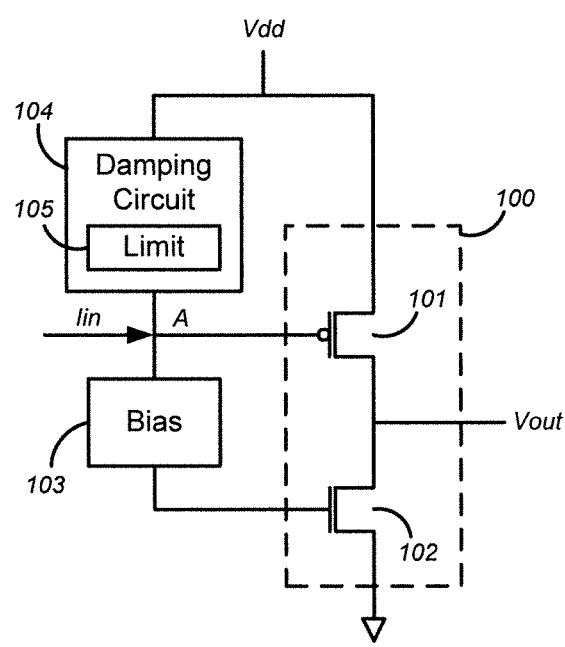
FIG. 1 illustrates an amplifier circuit according to one embodiment.

FIG. 1 illustrates an amplifier circuit according to one embodiment. The amplifier illustrated in FIG. 1 may exhibit an improved slew rate, for example. Slew rate is a circuit parameter that describes a circuit's ability to transition between different values. For example, voltage slew rate refers to the ability of a particular circuit to change a voltage from low to high or high to low at a particular node, such as an output node, for example. The amplifier shown in FIG. 1 includes an output stage 100 comprising a first output transistor 101. In this example, output transistor 101 is a PMOS transistor comprising a gate, a source, and a drain. The source is coupled to a power supply terminal to receive a power supply voltage Vdd. The gate receives a signal (here, a current input signal, Iin) to be amplified. The output stage 100 further includes a second output transistor 102. In this example, output transistor 102 is an opposite conductivity type NMOS transistor comprising a gate, a source, and a drain. The source is coupled to a negative supply reference, such as ground. In this example, the output stage transistors are biased (e.g., setting DC quiescent currents) using bias circuit 103. Bias circuit 103 comprises a first terminal to bias the gate of output transistor 101. A second terminal of bias circuit 102 may be coupled to the gate of output transistor 102 to bias the gate of the second output transistor 102, for example.

Features and advantages of the present disclosure include a damping circuit 104 with a current limiting component to improve slew rate at the gate of an output transistor, for example. Damping circuit 104 has a first terminal coupled to the power supply terminal to receive a power supply voltage, Vdd, and a second terminal coupled the gate of output transistor 101. Damping circuit 104 is configured to produce a high impedance at low frequencies and a low impedance at high frequencies, for example. A high impedance at low frequencies and low impedance at high frequencies reduces ("dampens") the gain of the amplifier at high frequencies while preserving the gain at low frequencies, which may be advantageous in audio applications, for example. The damping circuit 104 includes a current limit circuit 105. Current limit circuit 105 may limit current to the gate of output transistor 101 when a voltage on the gate of output transistor 101 decreases in response to the signal. For example, in some situations, current signal Iin may be such as to drop the voltage at node A on the gate of output transistor 101 very rapidly. If damping circuit 104 produces too much current into node A, it might reduce the speed at which node A is able to drop, thereby reducing the slew rate of the amplifier circuit. A current limit circuit 105 may be included in damping circuit 104 to limit the current into node A and increase the slew rate. As described in more detail below, the current limit circuit may include a resistive element configured in series with a current from an output of the damping circuit to the gate of the first output transistor. Example embodiments and implementation are provided in more detail below.

Figure 2:
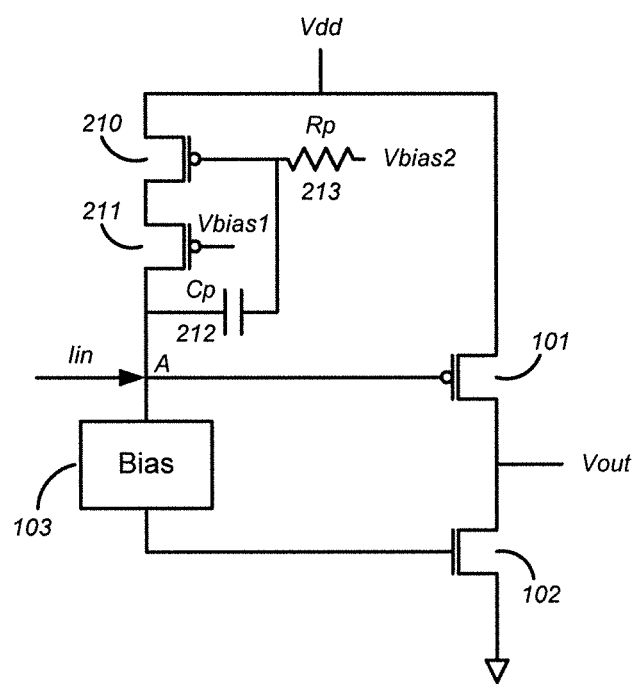
FIG. 2 illustrates an amplifier circuit with an example damping circuit according to another embodiment.

FIG. 2 illustrates an amplifier circuit with an example damping circuit according to another embodiment. FIG. 2 illustrates one example damping circuit according to an embodiment. In this example, a damping circuit includes a first transistor 210 having a first terminal, a second terminal, and a control terminal (e.g., a source, drain, and gate). The first terminal of transistor 210 is coupled to a power supply terminal to receive power supply voltage Vdd. A resistor 213 (Rp) has a first terminal coupled to the control terminal of transistor 210 and a second terminal coupled to a bias voltage, Vbias2. The damping circuit further includes a capacitor 212 having a first terminal coupled to the control terminal of transistor 210 and a second terminal coupled to node A and the gate of output transistor 101. In this example, the resistive element for current limiting is implemented using a second transistor 211 configured in series with a current path from the second terminal of transistor 210 to node A (e.g., the gate of output transistor 101). Transistor 211 has a first terminal, a second terminal, and a control terminal (e.g., a source, drain, and gate). In this example, the first terminal of transistor 211 is coupled to the second terminal of transistor 210. The second terminal of transistor 211 is coupled to the gate of the first output transistor 101. Finally, the control terminal of transistor 211 is coupled to a second bias voltage Vbias1. In one example implementation, transistor 211 is biased in triode, for example.

During operation, capacitor 212 provides a low frequency open circuit and a high frequency short between the gate and drain of transistor 210. Thus, at low frequencies, transistor 210 acts as a current source with a high output impedance. At high frequencies, transistor 210 acts as a diode connection (gate and drain connected together) having a low impedance to reduce the gain as described above. However, if node A at the gate of output transistor 101 is pulled from high to low (e.g., a negative slew) current through transistor 210 will be reduced by the action of transistor 211. For example, as the voltage on node A drops, the voltage across the terminals of transistor 210 (e.g., Vds) will increase, which may increase the current. However, with transistor 211 configured in series as shown, the voltage across the terminals of transistor 211 will also increase, and reducing the current into node A caused by a drop in voltage on node A. Accordingly, node A may be pulled down more easily because transistor 211 limits the current into the node that would otherwise prevent pull down.

Figure 3:
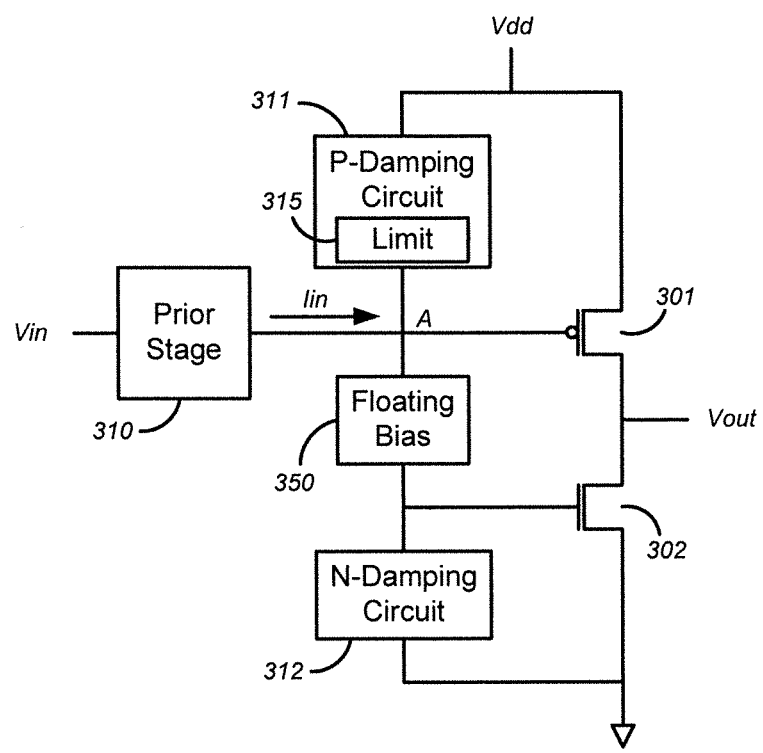
FIG. 3 illustrates an amplifier circuit according to another embodiment.

FIG. 3 illustrates an amplifier circuit according to another embodiment. In this example, an output stage includes a PMOS transistor 301 having a source coupled to Vdd and an opposite conductivity type NMOS transistor 302 having a source coupled to a negative reference (Vneg) such as ground. The drains of transistor 301 and 302 are coupled together at an output terminal Vout. In this example, the bias circuit is a floating bias circuit 350, an example of which is described below. A prior stage 310 receives an input voltage signal Vin and produces a current signal Iin which is coupled to node A and the gate of output transistor 301. The gate of output transistor 302 receives the signal to be amplified via a second terminal of bias circuit 350, which biases the gate of transistor 302. If Iin increases, the voltage on node A and the gates of transistor 301 and 302 increase, and if Iin decreases the voltage on node A and the gates of transistor 301 and 302 decrease. Transistors 301-302 amplify the current signal to produce an output voltage Vout.

In this example, the amplifier circuit includes both a P-damping circuit 311 and N-damping circuit 312. P-damping circuit 311 is coupled to the gate of PMOS transistor 301 to produce a high impedance at low frequencies and a low impedance at high frequencies to reduce the gain at high frequencies. Similarly, N-damping circuit 312 is coupled to the gate of NMOS transistor 302 and likewise reduces the gain at high frequencies. P-damping circuit 311 includes a current limit 315, which may include a resistive element coupled in series with a current from the damping circuit to the gate of transistor 301 to reduce the damping current during negative voltage transitions (slew) of the gate of transistor 301, for example.

Figure 4:
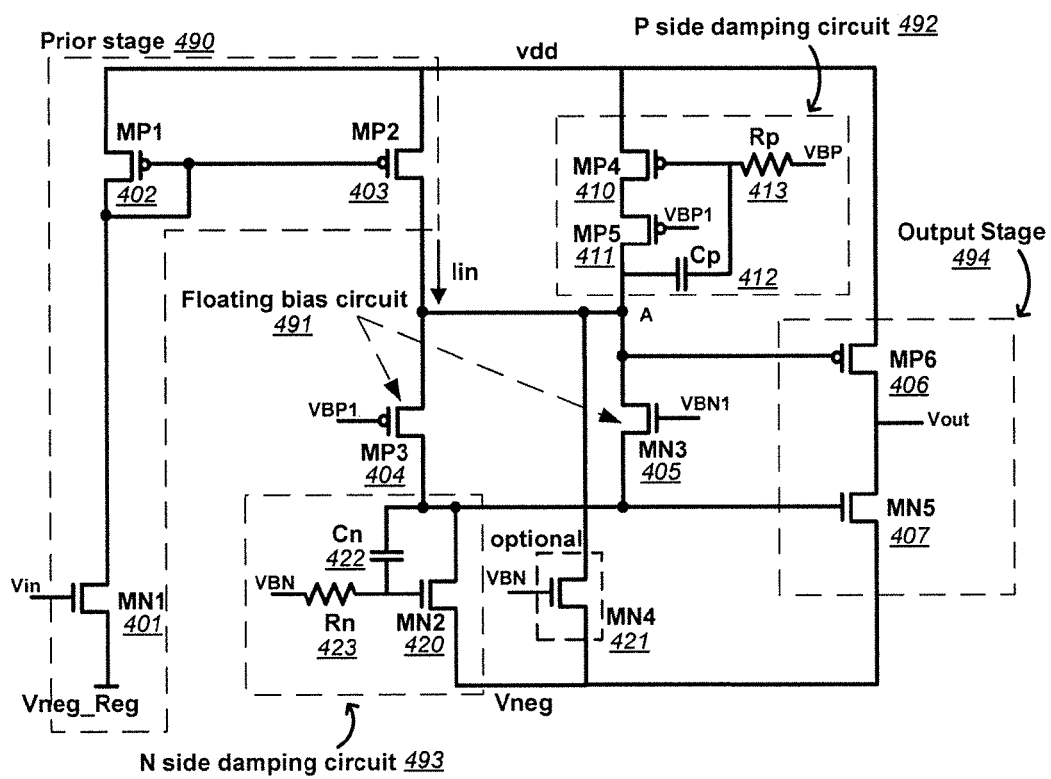
FIG. 4 illustrates an example amplifier circuit according to another embodiment.

FIG. 4 illustrates an example amplifier circuit according to another embodiment. The amplifier circuit in FIG. 4 advantageously exhibits a boosted slew rate. A prior stage 490 comprising transistors MN1 401, MP1 402, and MP2 403 may receive a voltage signal Vin and produce a current signal Iin into node A of a floating bias circuit 491 including transistors MN3 405 and MP3 404 of the amplifier circuit. This example amplifier includes P and N side damping circuits 492-493, the floating bias circuit 491 and an output stage 494. The P side damping circuit includes transistor MP4 410, capacitor Cp 412 and resistor Rp 413, while the N side damping circuit includes transistor MN2 420, capacitor Cn 422 and resistor Rn 423. The floating bias circuit including MN3 and MP3 receives bias voltages VBN1 (MN3) and VBP1 (MP3) on their control terminals (e.g. gates) and are used to bias the output stage. The output stage includes NMOS transistors MN5 407 and PMOS transistors MP6 406. MP6 and MN5 receive the input signal on their control terminals (e.g., gates), and drive the amplified signal to an output Vout.

The amplifier output stage includes floating bias circuit 491 between the gates of MP6 and MN5 using transistors MP3 and MN3. As mentioned above, MP3 receives a bias voltage VBP1 and MN3 receives a bias voltage VBN1. VBP1 and VBN1 are configured to set a voltage difference between the gates of MP6 and MN5 so that the gates move up and down together in response to the input current from the prior stage. For example, the DC voltage at the gate of output transistor MP6 is a Vgs of MP3 above VBP1, which sets the quiescent current in MP6. Similarly, the DC voltage at the gate of output transistor MN5 is a Vgs of MN3 below VBN1, which sets the quiescent current in MN5. In this example, the source of MP6 is coupled to Vdd and the source of MN5 is coupled to a lower power supply reference, Vneg.

The output stage further includes a P side damping circuit 492 and an N side damping circuit 493. The P side damping circuit is configured between the gate of MP6 and a positive power supply voltage Vdd. The N side damping circuit is configured between the gate of MN5 and a negative power supply voltage Vneg. At low frequencies, the input impedance of each damping circuit is high, and the input signal is passed to the output amplified. However, at high frequencies, the input impedance of each damping circuit is lower, so that high frequencies (e.g., transients) are attenuated before passing to the output.

In this example, an optional NMOS transistor MN4 421 is provided for sinking current from node A and the gate of MP6. MN4 has a gate coupled to a bias voltage VBN, a source coupled to Vneg, and a drain coupled to node A and the gate of MP6. MN4 may optionally sink a portion of a DC current from the P-side damping circuit 492. Accordingly, DC bias currents in the P-side and N-side damping circuits may be unequal.

The circuit shown in FIG. 4 advantageously improves slew rate. One problem associated with NMOS and PMOS devices is that a PMOS device such as MP4 (in the P side damping circuit) may experience a different slew rate during a transient process than an NMOS device such as MN2 and the optional MN4 (in the N side damping circuit) because the NMOS transistor may not be able to pull down internal node voltages as fast. The resulting asymmetry between positive and negative slew rate may cause intermodulation distortion (IMD), for example.

Embodiments of the present disclosure include a resistive element to impede current into a node being pulled down (e.g., node A) so that the node may respond faster and produce a faster slew rate at the output. In the example shown in FIG. 4, the resistive element is PMOS transistor MP5, which is biased in the triode (or linear) region of operation. As node A drops, a large current would typically be produced by MP4 in the P side damping circuit. The current from MP4 would typically oppose the pull down current through MN2 (and MN4, which is an optional device). However, features and advantages of the present disclosure include a resistive element configured in the P side damping circuit current path to reduce or limit the current from the damping circuit as node A drops.

In particular, the P side damping circuit shown in FIG. 4 includes a transistor MP4 having a terminal coupled to supply voltage Vdd, a capacitor having a first terminal coupled to node A (e.g., and control terminal of output transistor MP6) and a second terminal coupled to a control terminal of transistor MP4, and a resistor having a first terminal coupled to the control terminal of MP4 and a second terminal coupled to a bias voltage VBP. Transistor MP5 is configured in series with MP4 and biased in triode. As the voltage on node A drops, the drain of MP4 is pulled low. However, as the current through MP4 and MP5 increases, the voltage across the drain and source terminals of MP5 increases, which will in turn limit the Vds of MP4. Thus, the current from MP4 is reduced which allows MN2 and the optional MN4 to pull down node A more quickly and therefore the output stage to slew at a faster rate.

In one embodiment, transistor MP5 is biased with the same voltage, VBP1, that is used to bias MP3 in the floating bias circuit. In some example implementations, MP5 may be biased in triode. Since the source of MP3 is a Vgs above VBP1, and since the drain of MP5 is coupled to the source of MP3 at node A, setting the gate voltage of MP5 to VBP1 will set the drain a Vgs above VBP1, which places the device in triode.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An amplifier circuit comprising:
    an output stage comprising a first output transistor, the first output transistor comprising a gate, a source, and a drain, wherein the gate receives a signal to be amplified;
    a bias circuit comprising a first terminal to bias the gate of the first output transistor; and
    a damping circuit coupled the gate of the first output transistor configured to produce a high impedance at low frequencies and a low impedance at high frequencies, wherein the damping circuit includes a current limit circuit to limit current to the gate of the first output transistor when a voltage on the gate of the first output transistor decreases in response to the signal.

2. The amplifier circuit of claim 1 wherein the current limit circuit comprises a resistive element configured in series with a current from an output of the damping circuit to the gate of the first output transistor.

3. The amplifier circuit of claim 2 wherein the resistive element comprises a transistor biased in triode.

4. The amplifier circuit of claim 1 wherein the damping circuit comprises:
    a first transistor having a first terminal, a second terminal, and a control terminal, wherein the first terminal is coupled to a power supply terminal;
    a resistor having a first terminal coupled to the control terminal of the first transistor and a second terminal coupled to a first bias voltage;
    a capacitor having a first terminal coupled to the control terminal of the first transistor and a second terminal coupled to the gate of the first output transistor; and
    a second transistor having a first terminal, a second terminal, and a control terminal, wherein the first terminal of the second transistor is coupled to the second terminal of the first transistor, the second terminal of the second transistor is coupled to the gate of the first output transistor, and the control terminal of the second transistor is coupled to a second bias voltage.

5. The amplifier circuit of claim 1 wherein the bias circuit comprises a first transistor having a same conductivity type as the first output transistor, wherein the first transistor comprises a gate coupled to a bias voltage and a source coupled to the gate of the first output transistor to set a bias of the first output transistor.

6. The amplifier circuit of claim 1 further comprising a prior stage that receives an input voltage signal and produces a current signal to the gate of the first output transistor, wherein the first output transistor amplifies the current signal to produce an output voltage.

7. The amplifier circuit of claim 1, the output stage further comprising a second output transistor having an opposite conductivity type than the first output transistor and comprising a gate, a source, and a drain, wherein the bias circuit further comprises a second terminal to bias the gate of the second output transistor, and wherein the gate of the second output transistor receives a signal to be amplified on a second terminal of the bias circuit, wherein the damping circuit is a first damping circuit, the circuit further comprising a second damping circuit coupled the gate of the second output transistor configured to produce a high impedance at low frequencies and a low impedance at high frequencies.

8. The amplifier circuit of claim 7 wherein the bias circuit comprises a first transistor and a second transistor, wherein the first transistor has a same conductivity type as the first output transistor, the first transistor comprising a gate coupled to a first bias voltage, a source coupled to the gate of the first output transistor and a drain coupled to the gate of the second output transistor, wherein the second transistor has a same conductivity type as the second output transistor, the second transistor comprising a gate coupled to a second bias voltage, a source coupled to the gate of the second output transistor and a drain coupled to the gate of the first output transistor.

9. The amplifier circuit of claim 7 further comprising a transistor having a control terminal coupled to a bias voltage and a first terminal coupled to the gate of the first output transistor to sink at least a portion of a DC current from the first damping circuit.

10. The amplifier circuit of claim 1 wherein the bias circuit is a floating bias circuit.

11. A method comprising:
receiving a signal to be amplified on a gate of a first output transistor in an output stage, the first output transistor comprising a gate, a source, and a drain;
generating on a first terminal of a bias circuit to bias the gate of the first output transistor;
damping the signal using a damping circuit coupled the gate of the first output transistor, wherein the damping circuit is configured to produce a high impedance at low frequencies and a low impedance at high frequencies, and
limiting current to the gate of the first output transistor when a voltage on the gate of the first output transistor decreases in response to the signal.

12. The method of claim 11 wherein said limiting current is performed by a current limit circuit comprising a resistive element configured in series with a current from an output of the damping circuit to the gate of the first output transistor.

13. The method of claim 12 wherein the resistive element comprises a transistor biased in triode.

14. The method of claim 11, where in the signal is a current signal, the method further comprising receiving an input voltage signal in a prior stage and producing the current signal to the gate of the first output transistor, wherein the first output transistor amplifies the current signal to produce an output voltage.

15. The method of claim 11 wherein the output stage comprises a second output transistor having an opposite conductivity type than the first output transistor and comprising a gate, a source, and a drain, wherein the bias circuit further comprises a second terminal to bias the gate of the second output transistor, and wherein the gate of the second output transistor receives a signal to be amplified on a second terminal of the bias circuit, wherein the damping circuit is a first damping circuit, the method further comprising damping the current signal using a second damping circuit coupled the gate of the second output transistor, wherein the second damping circuit is configured to produce a high impedance at low frequencies and a low impedance at high frequencies.

16. The method of claim 11 wherein the bias circuit comprises a first transistor and a second transistor, wherein the first transistor has a same conductivity type as the first output transistor, the first transistor comprising a gate coupled to a first bias voltage, a source coupled to the gate of the first output transistor and a drain coupled to the gate of the second output transistor, wherein the second transistor has a same conductivity type as the second output transistor, the second transistor comprising a gate coupled to a second bias voltage, a source coupled to the gate of the second output transistor and a drain coupled to the gate of the first output transistor.

17. An amplifier circuit comprising:
a first output transistor of a first conductivity type having a control terminal, a first terminal, and a second terminal, wherein the first terminal is coupled to a first power supply voltage;
a second output transistor of a second conductivity type having a control terminal, a first terminal, and a second terminal, wherein the first terminal is coupled to a second power supply voltage and the second terminal is coupled to the second terminal of the first output transistor;
a first bias transistor of the first conductivity type having a control terminal coupled to a first bias voltage, a first terminal coupled to the control terminal of the first output transistor, and a second terminal coupled to the control terminal of the second output transistor;
a second bias transistor of the second conductivity type having a control terminal coupled to a second bias voltage, a first terminal coupled to the control terminal of the first output transistor, and a second terminal coupled to the control terminal of the second output transistor;
a first damping transistor having a first terminal coupled to the first power supply voltage, a second terminal, and a control terminal;
a first capacitor having a first terminal coupled to the control terminal of the first output transistor and a second terminal coupled to the control terminal of the first damping transistor;
a first resistor having a first terminal coupled to the control terminal of the first damping transistor and a second terminal coupled to a second bias voltage; and
a resistive element having a first terminal coupled to the second terminal of the first damping transistor and a second terminal coupled to the control terminal of the first output transistor.

18. The amplifier circuit of claim 17 wherein the resistive element comprises a transistor.

19. The amplifier circuit of claim 18 wherein the transistor is biased in triode.

20. The amplifier circuit of claim 18 wherein the transistor comprises a control terminal coupled to the first bias voltage.

* * * * *